(12) United States Patent
Okada

(10) Patent No.: US 6,872,663 B1
(45) Date of Patent: Mar. 29, 2005

(54) METHOD FOR REWORKING A MULTI-LAYER PHOTORESIST FOLLOWING AN UNDERLAYER DEVELOPMENT

(75) Inventor: Lynne A. Okada, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 341 days.

(21) Appl. No.: 10/302,235

(22) Filed: Nov. 22, 2002

(51) Int. Cl.[7] ............................................. H01L 21/302
(52) U.S. Cl. .................... 438/694; 438/696; 438/704; 438/717; 438/725; 438/736
(58) Field of Search ............................... 438/694, 696, 438/704, 717, 725, 736

(56) References Cited

U.S. PATENT DOCUMENTS

| | | | |
|---|---|---|---|
| 4,557,797 A | 12/1985 | Fuller et al. | |
| 4,770,739 A | 9/1988 | Orvek et al. | |
| 5,286,607 A | 2/1994 | Brown | |
| 6,110,624 A | * 8/2000 | Hibbs et al. | 430/5 |
| 6,127,089 A | 10/2000 | Subramanian et al. | |
| 6,210,846 B1 | * 4/2001 | Rangarajan et al. | 430/30 |
| 6,358,676 B1 | 3/2002 | Wu | |
| 6,514,860 B1 | * 2/2003 | Okada et al. | 438/687 |
| 6,627,387 B2 | * 9/2003 | Hsieh et al. | 430/313 |
| 6,767,833 B2 | * 7/2004 | Shih et al. | 438/706 |
| 6,812,131 B1 | * 11/2004 | Kennedy et al. | 438/623 |
| 2002/0036183 A1 | 3/2002 | Shibata | |

OTHER PUBLICATIONS

"Deep Ultraviolet Photoresists", Science and Technology at Almaden, Jul. 23, 2002, 3 pages, taken from the Internat at: http://www.almaden.ibm.com/st/projects/litho/.

* cited by examiner

*Primary Examiner*—Duy-Vu Des
*Assistant Examiner*—Binh X. Tran

(57) ABSTRACT

A method of processing a semiconductor device is disclosed and comprises patterning a multi-layer photoresist which comprises an imaging layer overlying an underlying layer. The patterning of the resist defines an exposed portion of an underlying process layer. The method further comprises inspecting the patterned multi-layer photoresist for defects and re-working the patterned multi-layer photoresist upon a failed inspection. The re-work process comprises depositing a protection layer over the patterned multi-layer photoresist and over the exposed portion of the underlying process layer. A portion of the protection layer and the imaging layer are then removed in a concurrent manner while leaving a remaining portion of the protection layer covering the exposed portion of the underlying process layer. A remaining portion of the protection layer and the underlying layer are then removed in a concurrent manner and such removal does not adversely impact the process layer.

16 Claims, 7 Drawing Sheets

METHOD FOR REWORKING A MULTI-LAYER PHOTORESIST FOLLOWING AN UNDERLAYER DEVELOPMENT

FIELD OF THE INVENTION

The present invention generally relates to semiconductor processing, and more particularly relates to a method of re-working a multi-layer photoresist when a resist inspection identifies a defect associated therewith.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller features sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the surface through an intervening master template (e.g., a mask or reticle) to generate a particular pattern. The exposed pattern on the photoresist is then developed with a solvent called a developer which makes the exposed pattern either soluble or insoluble depending on the type of photoresist (e.g., positive or negative resist). The soluble portions of the resist are then removed, thus leaving a photoresist mask corresponding to the desired pattern on the wafer for further processing.

Exposure of photoresists is performed typically with optical lithography. The minimum resolution achievable with a projection lithography tool is a function of the exposure wavelength and the resolving power or numerical aperture of the lens system. As lithography tool manufacturers have reduced the energy of the imaging radiation (for example, from 436 nm wavelengths to 248 nm wavelengths), the photoresist chemistry has changed as well. For example, traditional photoresist materials were supplanted by chemically amplified resist materials. As device feature sizes continue to decrease (e.g., down to less than 100 nm), lithography systems employing even shorter exposure wavelengths will be utilized (for example, 193 nm ArF or 157 nm $F_2$ excimer laser sources).

As highlighted above, the resolution of the lithography system may be improved by decreasing the imaging wavelength and/or increasing the numerical aperture of the lens system. Such solutions, however, tend to limit the ability to keep the photomask image in focus throughout the entire thickness of the resist film (e.g., a reduction in the depth of focus). Simply reducing the resist thickness is not always possible, since if the resist is too thin it can not function effectively as a mask for subsequent pattern transfer to the underlying material.

One solution to the above problem is to employ a bi-layer photoresist composed of an underlying layer and an overlying imaging layer, as illustrated in prior art FIG. 1. In the exemplary bi-layer resist 10 (sometimes called a multi-layer resist), an imaging layer 12 comprises a thin layer which is sufficiently thin to have the entire image focused therethrough during an exposure 14 thereof. Upon development of the imaging layer 12, resulting in the structure of prior art FIG. 2, the now exposed portion 16 of the underlying layer 18 is subjected to an etch process 20 (e.g., either wet or dry) to "develop" the underlying layer 18. The etch process employed with respect thereto is substantially selective with respect to both the remaining imaging layer 12 and an underlying material 22 to be processed (hereinafter referred to as the "process layer"), thereby resulting in a patterned resist 24, as illustrated in prior art FIG. 3.

During one or more portions of the above resist patterning process, a resist pattern inspection is performed in which the development of the bi-layers 12, 18 are evaluated to determine whether the development is sufficiently defect free to proceed with further processing. For example, after the development of the imaging layer 12 and prior to etching of the underlying layer 18, if a defect is identified, the imaging layer 12 may simply be removed and re-applied with the pattern transfer process being repeated. If, however, a defect is found after "development" of the underlying layer 18, re-work of the bi-layer is not desirable since such rework may undesirably result in the formation of shadow patterns in the underlying process layer 22.

For example, as illustrated in prior art FIG. 4A, the patterned bi-layer resist 24 is shown overlying the process layer 22. In many cases, if the etch of the imaging layer 12 is not substantially selective with respect to the exposed process layer 22, the removal of the imaging layer 12 during rework 26 causes an etching or gouging of the process layer 22 in an exposed portion 28, as illustrated in prior art FIG. 4B. Once the new bi-layer resist is deposited, exposed and patterned, the etching or gouging will have an impact upon its subsequent processing, thereby leading to shadow patterns as alluded to above. The above problem is pronounced in damascene type processing when the underlying layer 22 to be processed is a cap or etch stop type layer which contains silicon therein, and the imaging layer 12 also employs silicon for selectivity with respect to the underlying layer 18 of the bi-layer resist 24. In such circumstances, the chemistry employed to remove the imaging layer 12 during re-work is not selective with respect to the process layer 22 and the etching or gouging thereof is significant.

Therefore there is a need in the art for a method of reworking bi-layer resists without such rework impacting the underlying process layer.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The present invention relates to a method of processing, for example, processing of a semiconductor device. When utilizing lithographic techniques during processing, a multi-layer photoresist is deposited over a process layer, wherein the multi-layer photoresist comprises an underlying layer (UL) covered by an imaging layer (IL). The multi-layer photoresist is exposed or otherwise patterned to form a photoresist mask used for subsequent processing of an exposed portion of the process layer. For example, patterning the photoresist includes subjecting the multi-layer photoresist to a selective exposure through a photomask, for example, using radiation, wherein the radiation causes a chemical reaction in the exposed portion of the imaging layer. The exposed portion of the imaging layer is then developed, for example, by being subjected to a solvent, to remove the exposed portion thereof, and expose a portion of the underlying layer of the multi-layer photoresist. The underlying layer is then patterned, for example, using a dry development process to expose a portion of the process layer.

A defect inspection of the processed multi-layer photoresist is then performed. If no defects are found, processing continues, for example, implanting into the exposed portion of the process layer or etching the exposed process layer portion. If, however, defects are found associated with the patterned multi-layer resist, a re-work of the resist is performed. Such re-work comprises depositing a protection layer over the patterned resist, thereby covering the exposed portion of the process layer.

A portion of the protection layer and the imaging layer are then removed in a generally concurrent fashion while leaving a portion of the protection layer over the exposed process layer. For example, such removal may comprise a low selectivity etch with respect to the protection layer and the imaging layer. In so doing, the removal of the imaging layer does not adversely impact the process layer due to the remaining portion of the protection layer lying thereover. The re-work process then continues with a concurrent removal of the remaining portion of the protection layer and the underlying layer of the multi-layer resist, for example, via an etch which is selective with respect to the underlying process layer. In the above manner, the protection layer and the underlying layer are substantially completely removed without damage to the process layer, thereby allowing for a new photoresist to be formed thereover.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
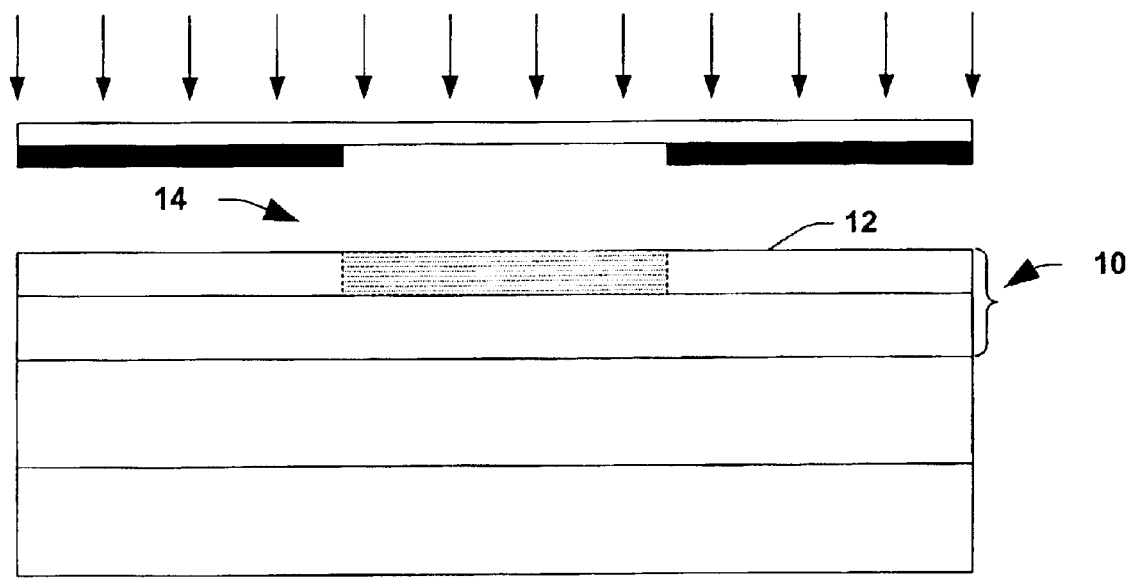
FIG. 1 is a fragmentary cross section diagram illustrating a multi-layer photoresist overlying a substrate and a selective exposure of a portion of an imaging layer associated with the multi-layer resist.
Figure 2:
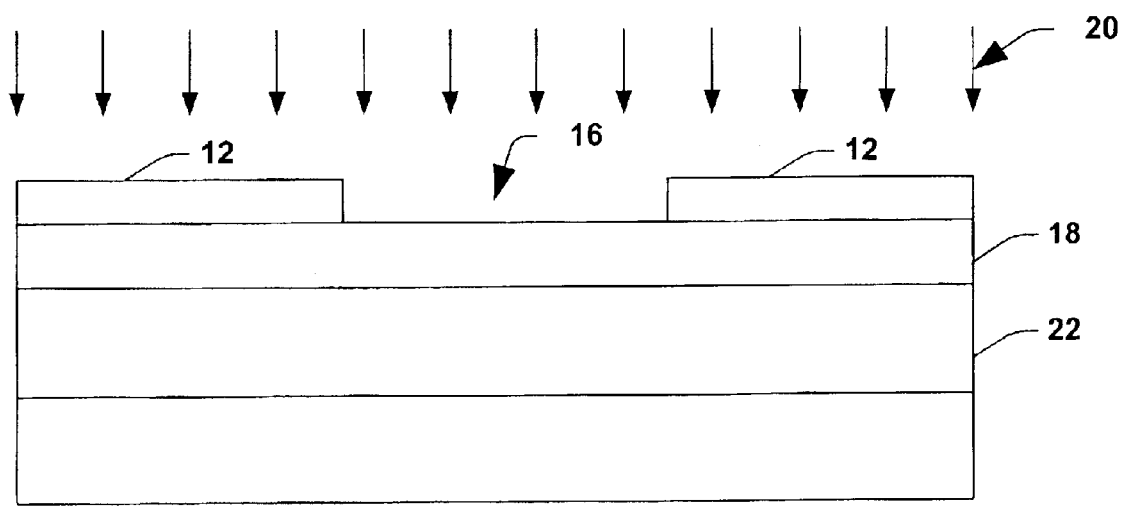
FIG. 2 is a fragmentary cross section diagram illustrating a dry development of an underlying portion of the multi-layer photoresist of FIG. 1, using the imaging layer as a mask.
Figure 3:
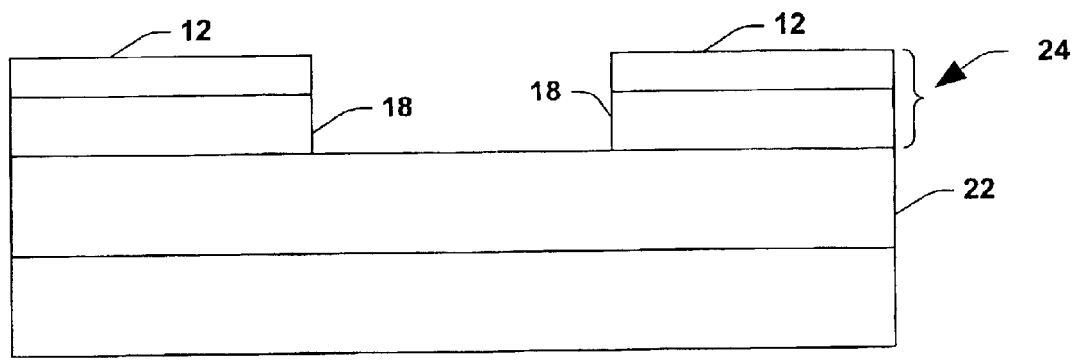
FIG. 3 is a fragmentary cross section diagram illustrating a patterned underlying layer of the multi-layer photoresist of FIG. 2, resulting in a patterned multi-layer photoresist and exposing a portion of a process layer.
Figure 4A:
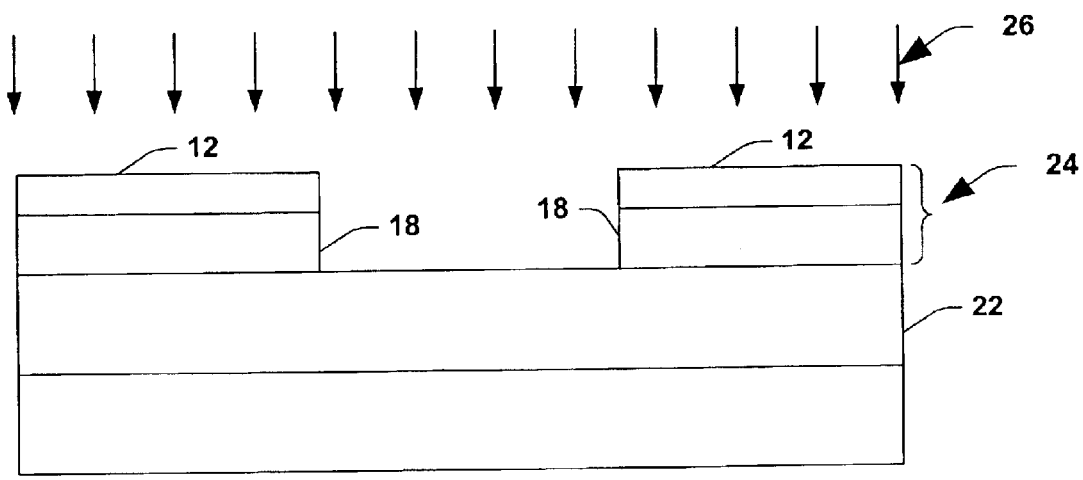
FIGS. 4A–4B are fragmentary cross section diagrams illustrating a conventional rework of the multi-layer photoresist, wherein a removal of the top imaging layer causes damage to the exposed process layer.
Figure 4B:
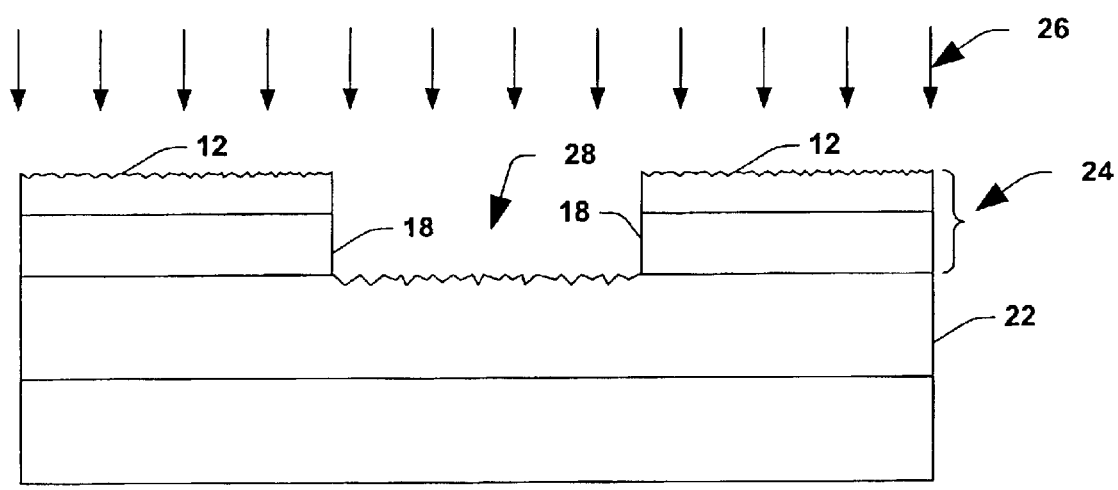

The following is a detailed description of the present invention made in conjunction with the attached Figures, wherein like reference numerals will refer to like elements throughout. The present invention is directed to a method of re-working a multi-layer photoresist. After patterning the photoresist, a portion of an underlying process layer is exposed therethrough and the resist is inspected for defects. Upon an affirmative identification of a defect, the patterned multi-layer photoresist (which comprises an underlying layer covered by an imaging layer) is covered with a protection layer, which also covers the exposed portion of the process layer. The protection layer and imaging layer are then removed in a generally concurrent fashion, after which a portion of the protection layer still resides over the exposed process layer. The underlying layer and remaining protection layer are then removed in a generally concurrent fashion. The re-work methodology of the present invention advantageously allows defects in a multi-layer photoresist to be eliminated without damage to the process layer.

Figure 5:
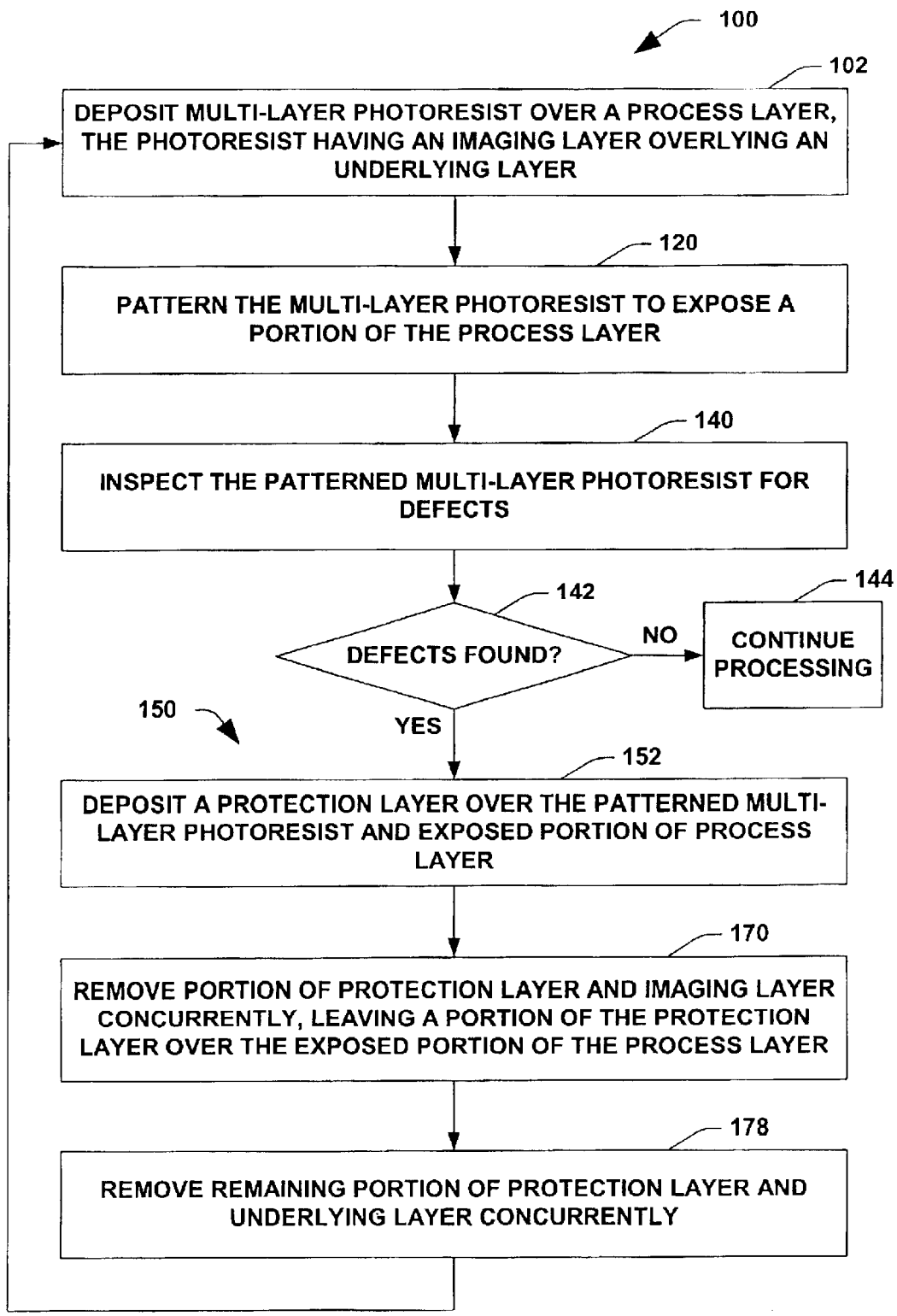
FIG. 5 is a flow chart illustrating a method of reworking a multi-layer photoresist in accordance with an aspect of the present invention.

Turning now to FIG. 5, a flow chart is provided, illustrating a method 100 of reworking a multi-layer photoresist in accordance with an aspect of the present invention. Although the method 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the method according to the present invention may be implemented in association with the apparatus and systems illustrated and described herein as well as in association with other apparatus or systems not illustrated.

Figure 6:
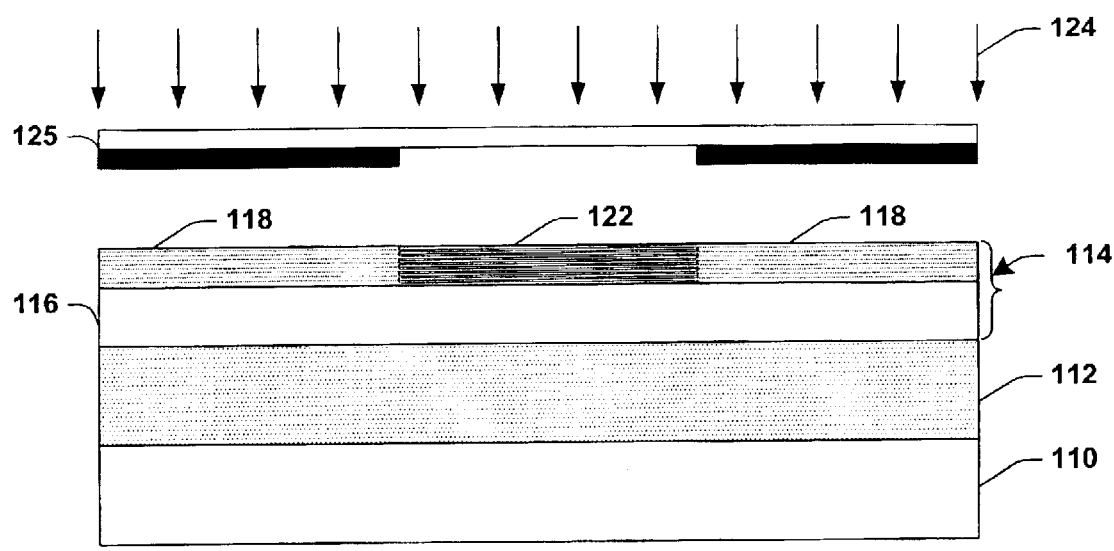
FIG. 6 is a fragmentary cross section diagram illustrating a multi-layer photoresist overlying a substrate and a selective exposure of a portion of an imaging layer associated with the multi-layer resist.

The method 100 begins at 102, wherein a multi-layer photoresist is deposited over a process layer. In the above example, the multi-layer resist comprises an underlying layer over which an imaging layer resides. For example, as illustrated in FIG. 6, a substrate 110 such as a silicon substrate, a polysilicon feature, isolation region, etc. is covered by a process layer 112, such as a cap or etch stop type layer which contains some silicon therein. Although the above materials or layers are provided by way of example, it should be understood that other materials or layer may be employed or may be applicable, and such alternatives are contemplated as falling within the scope of the present invention. A multi-layer photoresist 114 is deposited over the process layer 112, for example, via spin coating, deposition or the like. The resist 114 comprises an underlying layer 116 over which an imaging layer 118 is formed.

In accordance with one exemplary aspect of the present invention, both the underlying and imaging layers are photoresist type materials and are organic in nature. The underlying layer 116 is primarily employed to planarize the surface so that surface interference is minimized during subsequent exposure. In some cases, the underlying layer 116 is considered a planarizing, organic barrier anti-reflective coating (BARC) such as Shipley's UL material XP-2771. This material is typically coated in ranges from about 200 Angstroms to 5000 Angstroms. The imaging layer 118 such as Shipley's XP-2763 is substantially thinner (e.g., about 500 to about 200 Angstroms) than traditional, single layer photoresists, which are typically about 3000 to about 7000 Angstroms. The imaging layer 118 is exposed and developed similar to traditional photoresists, but has some silicon content therein. The silicon content advantageously allows for the imaging layer to oxidize during a subsequent patterning of the underlying layer 116, which may be patterned using a dry development process such as an etch. The oxidation of the imaging layer 118 provides an improved etch resistance thereof, thereby allowing the imaging layer to be substantially thin. As highlighted above, a thin imaging layer is advantageous because the thinner the layer, the easier it is for a low wavelength exposure to maintain focus therethrough.

Figure 7:
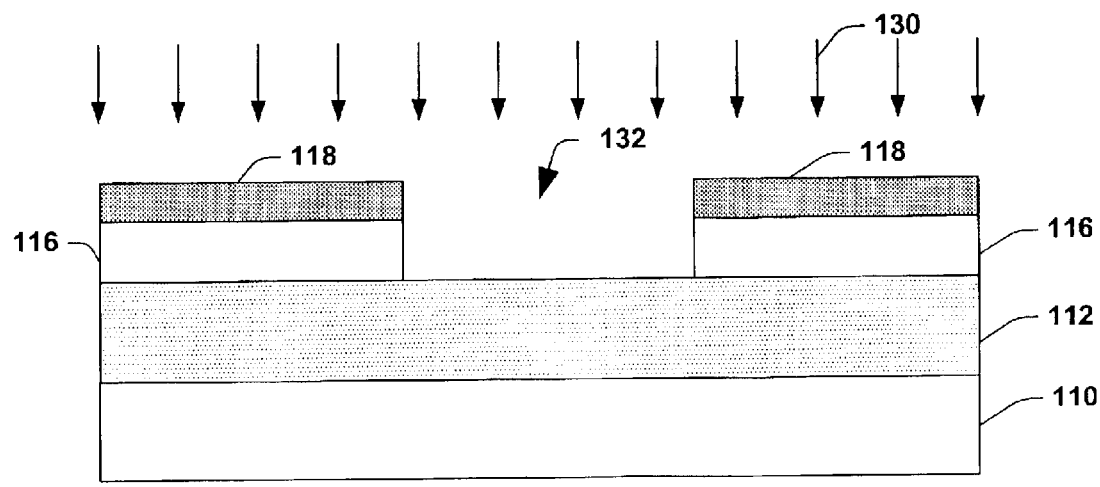
FIG. 7 is a fragmentary cross section diagram illustrating a dry development patterning of an underlying portion of the multi-layer photoresist of FIG. 6, using the imaging layer as a mask.

Returning to FIG. 5, the multi-layer photoresist is patterned at 120 to expose a portion of the process layer which resides thereunder. For example, as illustrated in FIG. 6, the imaging layer 118 is patterned by exposing a portion 122 thereof to radiation 124 through a mask 125. The imaging layer 118 is then developed, for example, wherein the exposed portion 112 becomes soluble due to its exposure and is removed by a wet developer solution, thereby exposing a portion of the underlying layer 116. The underlying layer 116 is then patterned via, for example, a dry development process 130 such as dry etching as illustrated in FIG. 7. In accordance with one aspect of the present invention, the imaging layer 118 has some silicon content therein, wherein the silicon content causes the imaging layer to oxidize during the dry development of the underlying layer 116. The oxidation of the imaging layer 118 during the etching of the underlying layer 116 advantageously improves the etch resistance of the imaging layer. As illustrated in FIG. 7, the patterning 130 of the underlying layer 116 results in a portion 132 of the process layer 112 being exposed.

Figure 8:
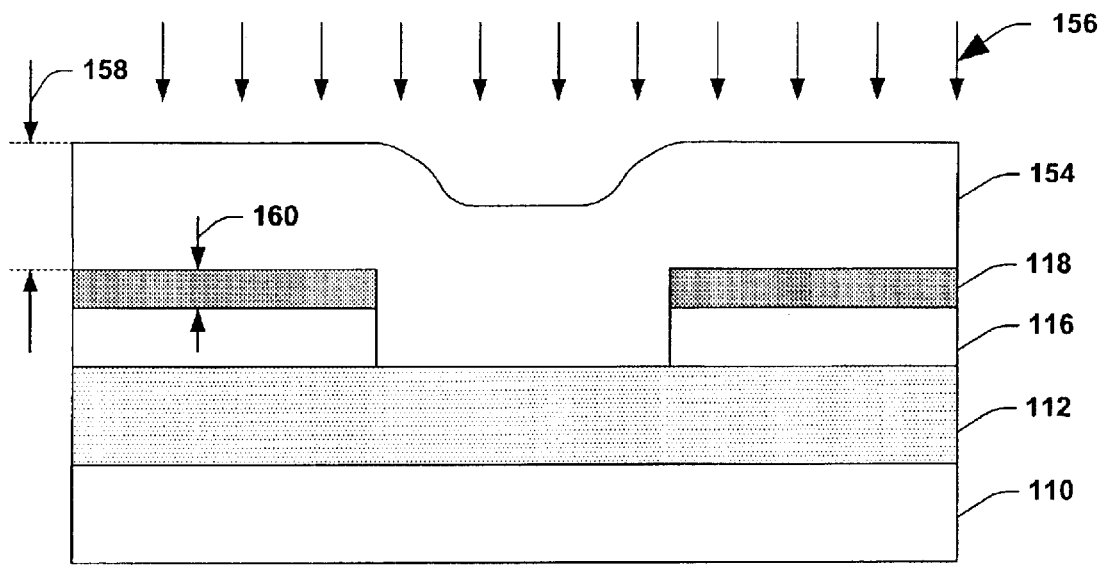
FIG. 8 is a fragmentary cross section diagram illustrating a formation of a protection layer over the patterned multi-layer resist during a re-work thereof in accordance with one aspect of the present invention.

An inspection of the patterned multi-layer resist 114 is then performed at 140, and if no defects are found at 142 (NO), processing continues at 144. For example, continued processing may depend upon the nature of the process layer 112. For example, the exposed portion 132 of the process layer may be subjected to an etch for patterning thereof, subjected to ion implantation, thermal processing, etc., as may be appreciated. If, however, defects are found within or are associated with the multi-layer resist 114 at 142 (YES), a re-work procedure 150 is employed. The re-work 150 of FIG. 5 comprises a series of acts and includes depositing a protection layer over the patterned resist to thereby cover the resist as well as the exposed portion of the underlying process layer at 152. For example, as illustrated in FIG. 8, a protection layer 154 resides over the patterned resist 114 (underlying layer 116 and imaging layer 118), as well as the exposed portion 132 of the process layer 112. The protection layer 154 may be formed over the resist 114 in any manner, for example, via spin coating or chemical vapor deposition (CVD), and any other manner of forming the protection layer is contemplated as falling within the scope of the present invention.

In accordance with one aspect of the present invention, the protection layer 154 comprises a sacrificial layer having a composition which renders a subsequent etch or patterning substantially non-selective with respect to the imaging layer 118, yet generally selective with respect to the process layer 112, as will be appreciated in the discussion that follows below. In such manner, a subsequent etch of the protection layer 154 causes the imaging layer 118 to also be removed, while leaving a portion of the protection layer over the exposed portion 132 of the process layer 112. For example, in one aspect of the invention, the protection layer 154 composition is the same as or similar to the underlying layer 116 (e.g., a BARC material), however, any material that generally meets the conditions highlighted above may be utilized and is contemplated as falling within the scope of the present invention.

In addition, a thickness 158 of the protection layer is sufficient to ensure that upon a concurrent removal of a portion of the protection layer 154 and the imaging layer 118, a portion of the protection layer still covers the exposed portion of the process layer 112. In the above manner, the removal of the imaging layer 118 during re-work does not cause damage to the process layer 112 due to the overlying protection layer 154 protecting the exposed portion 132 thereof.

For a multi-layer resist 114 having a patterned opening that is not substantially wide (and thus the protection layer 154 is not conformal with respect to the opening 132), a minimum thickness 158 of the protection layer 154 is at least equal to a thickness 160 of the imaging layer 118. For wider openings in the resist or underlying topography (e.g., in a trench first dual hard mask dual damascene integration), however, the protection layer 154 may need to be substantially thicker than the imaging layer 118 in order to ensure that upon a subsequent concurrent removal of the protection layer and the imaging layer 118, a portion of the protection layer 154 remains in the exposed portion 132 overlying the process layer 112.

Returning to FIG. 5, as alluded to above, a portion of the protection layer 154 and the imaging layer 118 are removed at 170. In accordance with one aspect of the present invention, the removal process 170 comprises performing an etch 172 (e.g., wet or dry) of the protection layer 154 and the imaging layer 118, wherein the etchant is generally not selective with respect to the materials. That is, the etch process 172 etches the protection layer 154 at a rate that is approximately the same as that of the imaging layer 118. Selectivities of about 1:1 imaging layer to protection layer are preferred, but ranges of about 0.5:1 to about 2.0:1 are also acceptable and are contemplated as falling within the scope of the present invention. An example of a non-selective dry etch process is use of the fluorocarbon gas $CF_4$ (e.g., $CF_4/O_2/Ar$) in a dry etcher. Because the thickness of the portion of the protection layer 154 in the opening 132 is thicker than the portion of the layer 154 overlying the imaging layer 118, once the protection layer 154 is removed over the imaging layer, the imaging layer 118 gets etched concurrently with continued protection layer removal in the opening 132.

Figure 9:
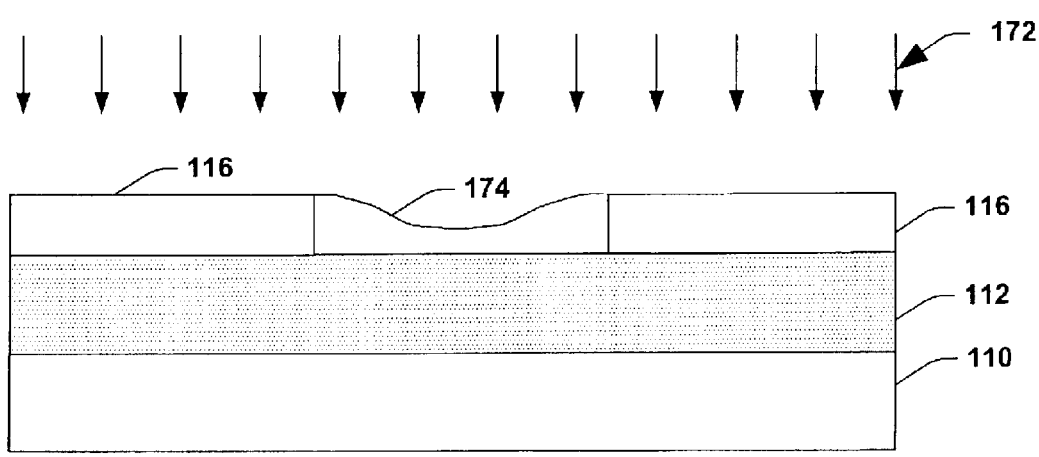
FIG. 9 is a fragmentary cross section diagram illustrating a removal process in which a portion of the protection layer and the imaging layer are removed in a generally concurrent manner, and leaving a portion of the protection layer overlying a process layer in accordance with another aspect of the present invention.

Once the imaging layer 118 is completely removed, the underlying layer 116 is exposed while a portion 174 of the protection layer still resides within the opening 132, thereby protecting the process layer 112, for example, as illustrated in FIG. 9. In accordance with one exemplary aspect of the present invention, a substantially complete removal of the imaging layer 118 can be monitored when the imaging layer has some silicon content therein. In such an instance, wherein the protection layer 154 and the underlying layer 116 do not contain silicon, by monitoring a loss of a silicon signal, a complete removal of the imaging layer can be detected, however, other monitoring or control methods may be employed and are contemplated as falling within the scope of the present invention.

Figure 10:
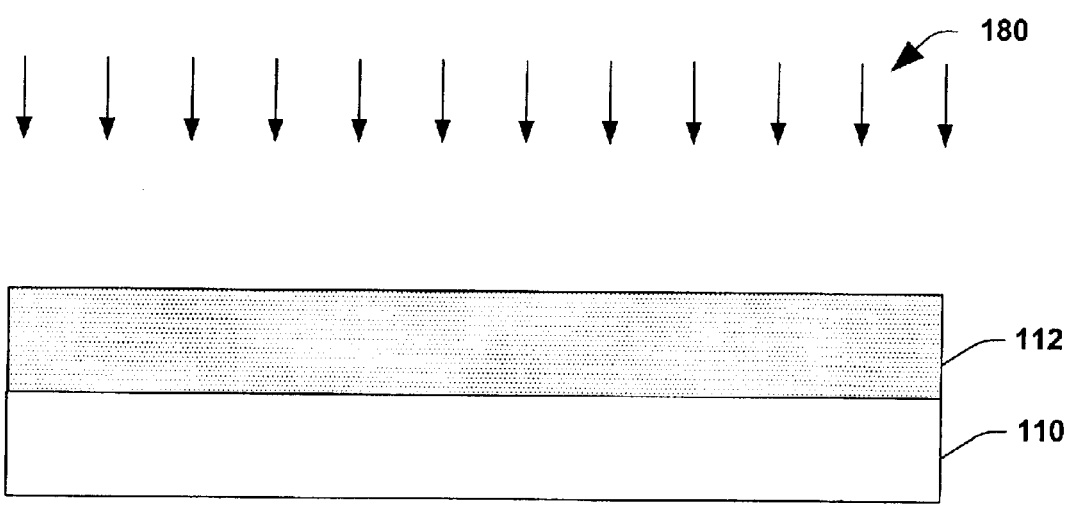
FIG. 10 is a fragmentary cross section diagram illustrating another removal process in which a remaining portion of the protection layer and the underlying layer are removed in a generally concurrent manner to thereby remove the multi-layer photoresist without substantially impacting the underlying process layer in accordance with still another aspect of the present invention.

Returning to FIG. 5, the re-work process 150 continues at 178 with a removal of the remaining portion 174 of the protection layer within the opening 132, as well as removal of the underlying layer 116 in a concurrent manner. For example, as illustrated in FIG. 10, the concurrent removal 178 may be performed with an etch process 180 which is generally unselective with respect to the remaining protection layer 174 and the underlying layer 116 (which is a nonissue when the protection layer 154 and the underlying layer 116 are chosen to be the same material), but is substantially selective with respect to the underlying process layer 112. This is achieved by selecting a process that excludes a fluorocarbon gas (e.g., $O_2$, $N_2+H_2$, $O_2+Ar$, etc.). In the above manner, the concurrent removal of the layers 174 and 116 will not substantially impact the underlying process layer.

Returning to FIG. 5, the method 100 then continues at 102 with a new deposition of the multi-layer photoresist over the process layer 112.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor device, comprising:
    patterning a multi-layer photoresist comprising an imaging layer overlying an underlying layer, the patterning defining an exposed portion of an underlying process layer;
    inspecting the patterned multi-layer photoresist for defects; and
    reworking the patterned multi-layer photoresist upon a failed inspection, wherein reworking further comprises:
        depositing a protection layer over the patterned multi-layer photoresist and over the exposed portion of the underlying process layer;
        removing a portion of the protection layer and the imaging layer in a concurrent manner while leaving a remaining portion of the protection layer covering the exposed portion of the underlying process layer; and
        removing the remaining portion of the protection layer and the underlying layer in a concurrent manner.

2. The method of claim 1, wherein the underlying layer of the multi-layer photoresist and the protection layer are the same material.

3. The method of claim 1, wherein the protection layer within an opening overlying the exposed portion of the underlying process layer is not conformal with respect to the opening, and wherein a thickness of the protection layer is at least as thick as a thickness of the imaging layer.

4. The method of claim 1, wherein removing the portion of the protection layer and the imaging layer in a concurrent manner comprises etching the portion of the protection layer and the imaging layer with a generally non-selective etch chemistry.

5. The method of claim 4, wherein the imaging layer is generally not selective with respect to the underlying process layer during an etch thereof.

6. The method of claim 4, further comprising:
    monitoring a signal associated with the imaging layer material during the etching of the portion of the protection layer and the imaging layer; and
    discontinuing the etching when the signal indicates that the imaging layer has been removed.

7. The method of claim 1, wherein removing the remaining portion of the protection layer and the underlying layer in a concurrent manner comprises etching the remaining portion of the protection layer and the underlying layer with an etch chemistry which is substantially selective with respect to the underlying process layer.

8. The method of claim 7, wherein the etch chemistry employed to etch the remaining portion of the protection layer and the underlying layer is not selective with respect to either layer being etched.

9. A method of processing a semiconductor device, comprising:
    patterning a multi-layer photoresist comprising an imaging layer containing silicon overlying an underlying layer, the patterning defining an exposed portion of an underlying process layer containing silicon;
    inspecting the patterned multi-layer photoresist for defects; and
    reworking the patterned multi-layer photoresist upon a failed inspection, wherein reworking further comprises:
        depositing a protection layer over the patterned multi-layer photoresist and over the exposed portion of the underlying process layer;
        removing a portion of the protection layer and the imaging layer in a concurrent manner while leaving a remaining portion of the protection layer covering the exposed portion of the underlying process layer; and removing the remaining portion of the protection layer and the underlying layer in a concurrent manner.

10. The method of claim 9, wherein the underlying layer of the multi-layer photoresist and the protection layer are the same material.

11. The method of claim 9, wherein the protection layer within an opening overlying the exposed portion of the underlying process layer is not conformal with respect to the opening, and wherein a thickness of the protection layer is at least as thick as a thickness of the imaging layer.

12. The method of claim 9, wherein removing the portion of the protection layer and the imaging layer in a concurrent manner comprises etching the portion of the protection layer and the imaging layer with a generally non-selective etch chemistry.

13. The method of claim 12, wherein the imaging layer is generally not selective with respect to the underlying process layer during an etch thereof.

14. The method of claim 12, further comprising:
monitoring a signal associated with the imaging layer material during the etching of the portion of the protection layer and the imaging layer; and
discontinuing the etching when the signal indicates that the imaging layer has been removed.

15. The method of claim 9, wherein removing the remaining portion of the protection layer and the underlying layer in a concurrent manner comprises etching the remaining portion of the protection layer and the underlying layer with an etch chemistry which is substantially selective with respect to the underlying process layer.

16. The method of claim 15, wherein the etch chemistry employed to etch the remaining portion of the protection layer and the underlying layer is not selective with respect to either layer being etched.

* * * * *